United States Patent [19]

Ma

[11] Patent Number: 5,729,047
[45] Date of Patent: Mar. 17, 1998

[54] METHOD AND STRUCTURE FOR PROVIDING SIGNAL ISOLATION AND DECOUPLING IN AN INTEGRATED CIRCUIT DEVICE

[75] Inventor: Manny K. F. Ma, Boise, Id.

[73] Assignee: Micron Technology, Inc., Boise, Id.

[21] Appl. No.: 622,465

[22] Filed: Mar. 25, 1996

[51] Int. Cl.[6] .................... H01L 29/40; H01L 29/00
[52] U.S. Cl. .................... 257/664; 257/508; 257/524
[58] Field of Search .................... 257/508, 524, 257/664

[56] References Cited

U.S. PATENT DOCUMENTS

| | | | |
|---|---|---|---|
| 4,866,507 | 9/1989 | Jacobs et al. | 357/74 |
| 4,908,694 | 3/1990 | Hidaka et al. | 257/664 |
| 5,135,889 | 8/1992 | Allen | 437/195 |
| 5,241,211 | 8/1993 | Tashiro | 257/506 |
| 5,262,353 | 11/1993 | Sun et al. | 437/195 |
| 5,357,138 | 10/1994 | Kobayashi | 257/664 |

FOREIGN PATENT DOCUMENTS 58-148436  9/1983  Japan .................... 257/664

*Primary Examiner*—Wael Fahmy
*Assistant Examiner*—Howard Weiss
*Attorney, Agent, or Firm*—Schwegman, Lundberg, Woessner & Kluth, P.A.

[57] ABSTRACT

A signal isolation and decoupling structure fabricated in an integrated circuit device for providing signal isolation and decoupling for signal carrying conductors of the integrated circuit device, wherein one of the conductors is embedded in dielectric material and enclosed within an isolation structure of an electrically conductive material which is formed in the integrated circuit device and extends substantially the length of the conductor, the isolation structure including top and bottom walls of electrically conductive material and first and side walls, also of an electrically conductive material, which electrically interconnect the top and bottom walls, forming an enclosure around the conductor. Also described is a method for fabricating the isolation structure in the integrated circuit device.

18 Claims, 4 Drawing Sheets

METHOD AND STRUCTURE FOR PROVIDING SIGNAL ISOLATION AND DECOUPLING IN AN INTEGRATED CIRCUIT DEVICE

FIELD OF THE INVENTION

The present invention relates generally to integrated circuit devices, and in particular the present invention relates to a method and structure for providing signal isolation and decoupling in an integrated circuit device, such as random access memory devices.

BACKGROUND OF THE INVENTION

Random access memory devices for storing digital data have usually taken the form of integrated circuit devices having thousands of memory cells. With the constant development of faster computer and communication applications, devices and signal carrying conductors within random access memory devices and other integrated circuit devices are becoming denser. As the signal carrying conductors become more dense, the separation between adjacent signal carrying conductors is decreased. Locating signal carrying conductors closer together in integrated circuit memory devices can result in significant signal coupling or signal cross-talk between signal carrying conductors that extend in close proximity to one another in the integrated circuit structure. This is particularly true for signal carrying conductors that carry fast switching signals, such as input/output conductors, address input conductors, clock signal conductors or any other type of "noisy" signal conductors. Cross-talk in integrated circuit memory devices can result in corruption of data in the storage device in the memory device as data is written into the memory or read out of the memory.

There are many other integrated circuit devices in which unwanted signal coupling can adversely affect operation of the devices. One such application is in field emission display devices. Field emission display devices include conductors which carry high potential drive signals. When the drive signal conductors for several field emission display devices are located in close proximity to one another, the drive signal for one of the field emission devices can be coupled to the drive signal conductor for another field emission device, causing unwanted activation of the latter field effect device.

For the reasons stated above, and for other reasons stated below which will become apparent to those skilled in the art upon reading and understanding the present specification, there is a need in the art for a method and structure for providing signal isolation and decoupling in integrated circuit devices.

SUMMARY OF THE INVENTION

The present invention provides a signal isolation and decoupling structure that is fabricated in an integrated circuit device for providing electrical isolation between signal carrying conductors, portions of which extend in close proximity to one another in the integrated circuit device, and wherein at least one of the conductors is carrying fast switching signals.

In accordance with one embodiment, the signal isolation and decoupling structure includes first and second elements of an electrically conductive material that are spaced apart from one another. A dielectric material is located between the first and second elements and at least one of the conductors is embedded in the dielectric material. The first and second elements are electrically interconnected by an interconnecting means which includes a third element of an electrically conductive material that electrically interconnects the first and second elements along at least a portion of the length of the embedded conductor, forming an enclosure of electrically conductive material around the embedded conductor that at least partially encloses the embedded conductor for electrically isolating the embedded conductor from other conductors located externally of the enclosure.

In accordance with another aspect of the invention, there is provided a method of providing signal isolation for signal carrying conductors of an integrated circuit device. The method comprises the steps of embedding at least one of the conductors in a dielectric material, and fabricating an isolation structure of an electrically conductive material that extends around the embedded conductor along a portion of the length of the embedded conductor on the substrate of the integrated circuit device to at least partially enclose the conductor within conductive material on the integrated circuit device. In accordance with one embodiment of the invention, the conductor is enclosed within conductive material by forming first and second planar layers of conductive material on the integrated circuit device in a parallel spaced relationship, and forming on the integrated circuit device first and second walls of conductive material which interconnect the first and second planar layers to form an enclosure of conductive material around the conductor.

Further in accordance with the invention there is provided a method for fabricating a signal isolation and decoupling structure in an integrated circuit device for signal carrying conductors of the integrated circuit device. In accordance with the method, a first layer of conductive material is formed on a substrate of the integrated circuit device. Then, a first layer of dielectric material is provided on the first layer of conductive material. One of the conductors is formed on the first layer of dielectric material and a second layer of dielectric material if provided on the first layer of dielectric material and on the conductor to embed the conductor in the dielectric material. Then, a second layer of conductive material is formed on the second layer of dielectric material. Finally, the first and second layers of conductive material are electrically interconnected to enclose the conductor within conductive material.

DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

The signal isolation and decoupling structure provided by the present invention can be fabricated in any integrated circuit device having a plurality of signal carrying conductors. The invention is described with reference to an application in a memory device such as, but not limited to, programmable logic devices, PROMs, EPROMs, EEPROMs, and memories such as SRAMs and DRAMs. However, the signal isolation and decoupling structure can be used in any integrated circuit device wherein it is desirable to prevent signal coupling between signal carrying conductors that extend in close proximity to one another. The signal isolation structure is particularly useful in preventing coupling between signal carrying conductors that carry fast switching signals, commonly referred to as "noisy" signal conductors, and between "noisy" signal conductors and other signal conductors, such as data conductors, bias conductors, and the like. "Noisy" signal conductors include, but are not limited to, input/output conductors, address input conductors, clock signal conductors and any other type of signal conductors that carry fast switching signals. Another application of the signal isolation and decoupling structure is in field emission display devices that include conductors which carry high potential drive signals which are located in close proximity to one another. In such application, the signal isolation and decoupling structure isolates the drive signal carrying conductors of the field emission devices from one another to prevent unwanted activation of the field effect devices.

Figure 1:
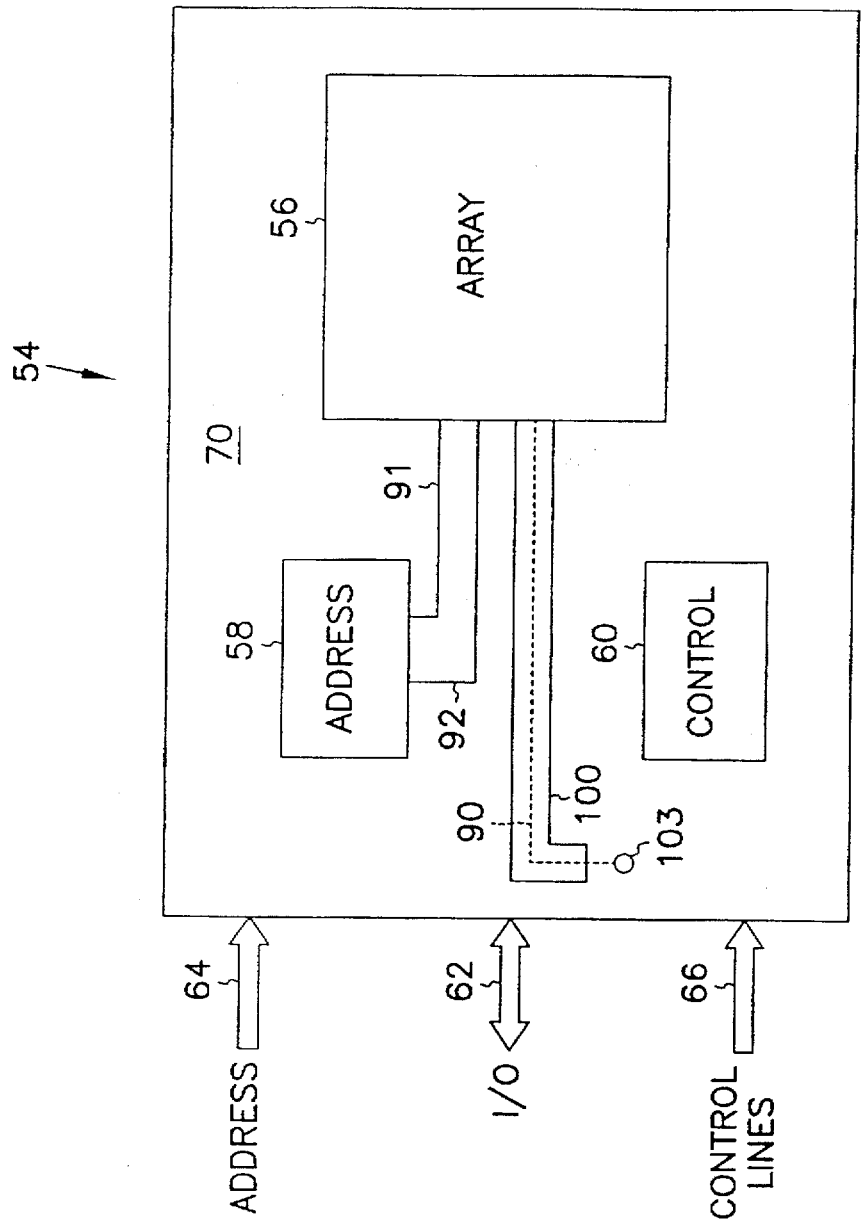
FIG. 1 is a block diagram of a memory device incorporating the signal isolation and signal decoupling structure provided by the invention.

Referring to the drawings, FIG. 1, illustrates a memory device 54 which includes a die 70 having formed thereon an array of memory cells 56, address circuitry 58 for addressing the memory cells using address data supplied via external address conductors 64, control circuitry 60 which are formed on the integrated circuit device and connected with an external micro-controller via input and output connections 62 and external control conductors 66 for communicating data with the micro-controller. By way of example, the memory device 54 can be operated as a burst EDO memory device in the manner disclosed in co-pending U.S. patent application Ser. No. 08/370,761, entitled BURST EDO MEMORY DEVICE, by Zagar et al., and assigned to the assignee of the present invention, and which application is incorporated herein by reference.

The signal isolation and decoupling structure of the invention, hereinafter referred to as the isolation structure, is fabricated in the integrated circuit memory device 54 for preventing unwanted signal coupling between signal carrying conductors, such as input/output conductors, such as conductor 90, address input conductors, such as conductors 91 and 92, and/or control conductors, for example, of the integrated circuit memory device that extend in close proximity to one another as well as between these "noisy" signal conductors and conductors carrying data signals, for example.

Figure 2:
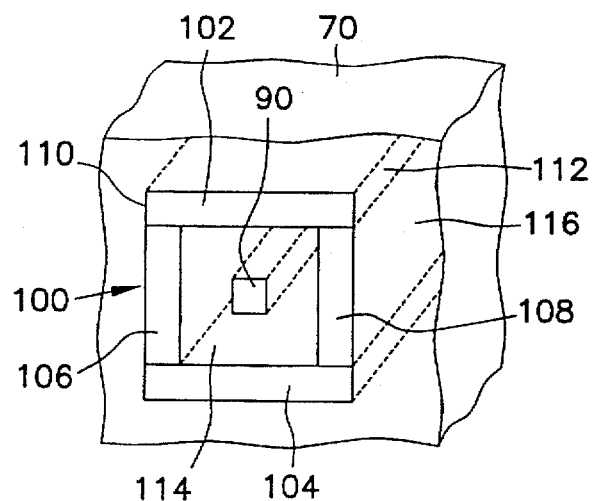
FIG. 2 is a diagrammatic view, in perspective, of a portion of FIG. 1 and illustrating the signal isolation and decoupling structure incorporated therein.
Figure 3:
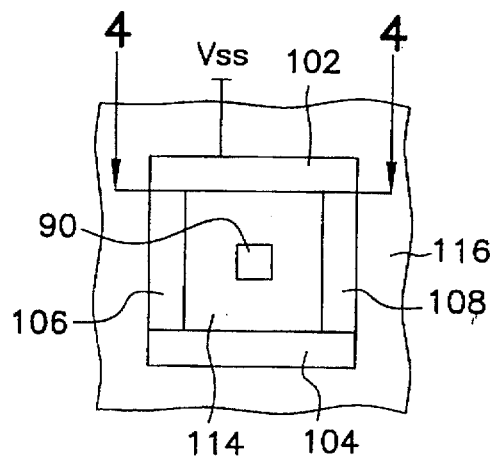
FIG. 3 is a diagrammatic end view of the portion of the signal isolation and decoupling structure shown in FIG. 2.
Figure 4:
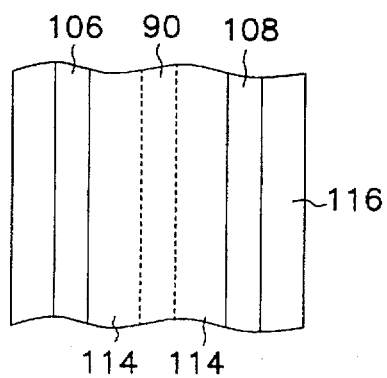
FIG. 4 is a vertical sectional view taken along the line 4—4 of FIG. 3.

More specifically, FIGS. 2-4 are diagrammatic views of a portion of the die 70 of the memory device 54 (FIG. 1) in which the isolation structure provided by the invention, has been fabricated for providing isolation for one of the conductors, such as conductor 90, of the integrated circuit memory device 54. It will be understood by those skilled in the art that many such isolation structures are provided in the integrated circuit memory device 54 for providing signal isolation and decoupling for a plurality of conductors of the integrated circuit memory device 54. The isolation structures are formed during fabrication of the integrated circuit memory device using conventional integrated circuit processing techniques. The isolation structures can be provided at different layers of the integrated circuit memory device where signal isolation is needed for conductors at such locations within the integrated circuit memory device. Thus, the fragmentary views of the isolation structure provided by FIGS. 2-4, and also by FIGS. 5-17, are representative of a small portion of one of many isolation structures that are formed in the integrated circuit memory device fabricated in accordance with the present invention.

Figure 7:
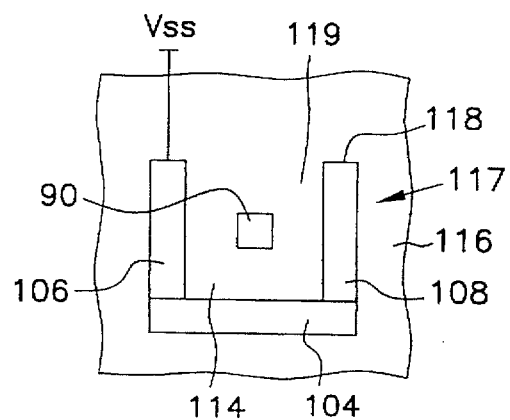
FIG. 7 is a diagrammatic end view of a portion of a signal isolation and decoupling structure that is open at the top in accordance with a further embodiment.

Referring additionally to FIG. 1, the isolation structure provided by the invention, includes an enclosure 100 which surrounds the conductor 90, which is an elongated element. The enclosure extends over a portion of the integrated circuit device, along at least a portion of, and preferably along substantially the entire length or extent of the conductor 90 in the integrated circuit memory device. The isolation structure is embodied as an elongated, box-like structure, generally rectangular in cross-section, having a first element or top wall 102, a second element or bottom wall 104, a third element or side wall 106 and a fourth element or side wall 108, all of which are made of a highly electrically conductive material. The top wall 102 and the bottom wall 104 extend in a parallel spaced relationship. The side wall 106 extends between the top and bottom walls at one side 110 thereof and electrically interconnects the top and bottom walls. Similarly, the side wall 108 extends generally parallel to side wall 106 between the top and bottom walls at the opposite side 112 thereof and electrically interconnects the top and bottom walls 102 and 104. The side walls 106 and 108 are spaced apart from one another Although in one embodiment the isolation structure is described as being generally rectangular in cross-section and having side walls and top and bottom walls, the isolation structure can include an enclosure 117 that is open at the top 118, or at the bottom, providing a generally U-shaped channel 119, as shown in FIG. 7, in which the conductor 90 being shielded is located. In this embodiment, the conductor is partially enclosed within the isolation structure formed by bottom wall 104 and side walls 108 and 106, the enclosure being closed on the three sides formed by bottom wall 104 and side walls 108 and 106 and being open on the fourth or top side 118. Alternatively, the isolation structure can be closed at the top and bottom and open at either one of the sides. Moreover, the isolation structure can have a cross-section that is generally cylindrical, triangular or some other shape and with the conductor being shielded being embedded in dielectric material within the isolation structure. Also, different portions of a given isolation structure can have different cross-sections. Although in one preferred embodiment, the isolation structure and the conductor, or conductors, it shields are described as extending generally horizontally, the isolation structure and the conductor contained within the isolation structure, or portions of the isolation structure and conductor, can extend vertically in the integrated circuit device.

The interior of the enclosure 100 is filled with a dielectric material 114 which is located between the top and bottom walls and the side walls of the enclosure 100 and the conductor 90 is embedded in the dielectric material. Preferably, the dielectric material is silicon dioxide $SiO_2$. However, other dielectric materials can be used as is known in the art. The thickness and composition of the dielectric material are selected so that the combination of the enclosure 100 and the dielectric material provides good decoupling between the conductor 90 that is contained within the isolation structure and any conductor or conductors located in the proximity of the conductor 90 but located externally of the enclosure 100. The isolation structure by virtue of its being formed within the integrated circuit memory device 54 is surrounded by dielectric material 116.

In the exemplary embodiment, the top wall 102 and the bottom wall 104 are made of a metal, preferably aluminum. However, the top and bottom walls can be made of other highly electrically conductive materials that are commonly used in the fabrication of integrated circuit devices. The side walls 106 and 108 are made of a metal, preferably tungsten, or other highly conductive materials such as silicides, preferably formed with tungsten ($TuSi_2$), titanium ($TiSi_2$) or other suitable materials. As will be shown the tungsten metal is deposited in a pair of channels that are formed in the dielectric material, filling the channels with the electrically conductive material, providing in each of the channels a wall of metal that extends from the lower conductive layer to the upper conductive layer. The top wall, the bottom wall and the side walls form an enclosure of electrically conductive material around the conductor.

Figure 5:
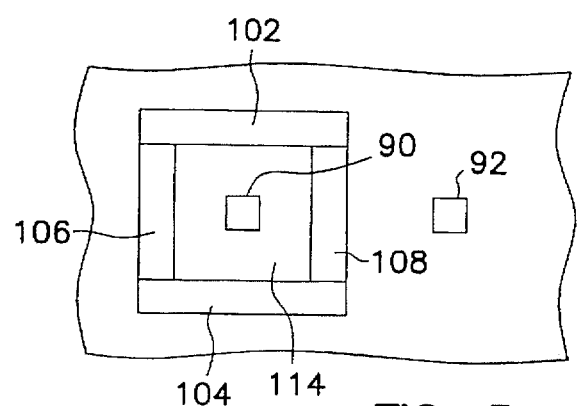
FIG. 5 is a diagrammatic end view similar to FIG. 3 and illustrating a further signal carrying conductor located externally of the signal isolation and decoupling structure.

The enclosure 100 electrically isolates the conductor 90 from one or more other conductors of the integrated circuit memory device, such as conductor 92 shown in FIG. 5 that is located externally to the isolation structure. Typically, the conductor 90 that is located within the isolation structure is a "noisy" conductor, that is, a conductor that carries fast switching signals, such as but not limited to and input/output conductor, an address input conductor, a clock signal conductor for example. The enclosure 100 and the conductor 90 contained within the enclosure form a coaxial assembly in the integrated circuit memory device that functions in a manner similar to that for a discrete coaxial cable. The isolation structure substantially prevents any signals that are radiated from the conductor from being coupled to a conductor, such as conductor 92 shown in FIG. 5, that is located in the proximity of the conductor 90, but located external to the isolation structure provided by the invention. Likewise, the isolation structure substantially prevents pickup by the conductor 90 of any signals that are radiated by the conductor 92, should that conductor be the "noisy" conductor. Although conductors 90 and 92 are shown located horizontally in side by side relation, the conductors can be located vertically one above the other in the integrated circuit structure.

The length of the conductive layers that form the top wall 102 and the bottom wall 104, as well as the length of conductive material that forms the side walls 106 and 108, is determined by the length of the conductor that the structure isolates. In the exemplary embodiment, the width of the enclosure is approximately four times the thickness of the conductor 90 contained there within and the height of the side walls is equal to the width of the conductive layers that form the top and bottom walls so that the conductor 90 is centered in the enclosure 100. The top wall 102, the bottom wall 104 and the side walls 106 and 108 are generally planar in shape and, preferably are of substantially the same thickness. However, the side walls and/or the top and bottom walls can have different thicknesses.

Figure 6:
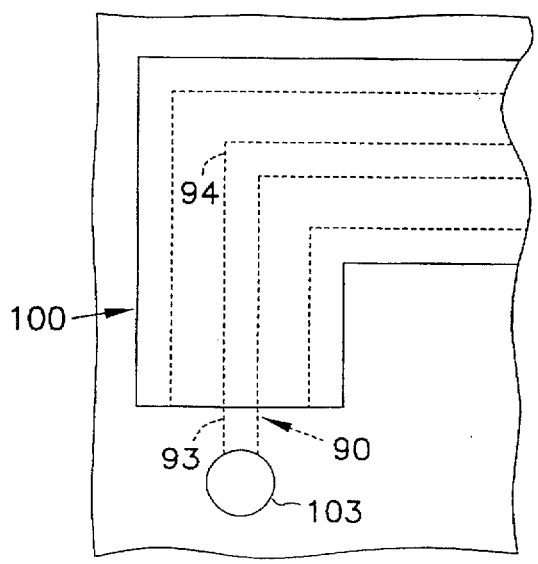
FIG. 6 is a simplified representation a further portion of the integrated circuit of FIG. 1, illustrating how the signal isolation and decoupling structure is applied to a portion of the conductor having a right angle bend.

Referring to FIGS. 1 and 6, the end portion 93 of the conductor 90 is extends beyond the enclosure 100 at locations where it connects to an input/output pin 103 of the integrated circuit device, shown in FIG. 6, and where it connects to a circuit element of the integrated circuit device.

In the preferred embodiment, the conductor 90 is centered within the enclosure 100, as illustrated in FIG. 3, for example. However, the conductor 90 can be located closer to any one wall or to any pair of adjacent walls of the enclosure. Moreover, the isolation structure provided by the invention can provide isolation for portions of the conductor 90 that have right angle bends, such as portion 94 shown in FIG. 6. In such application, the enclosure 100 formed by the isolation structure follows the contour of the conductor at the right angle bend 94 as is illustrated in FIG. 6.

Referring again to FIG. 2, in the exemplary embodiment, the conductive layer that forms the top wall 102 is connected to ground or Vss for the integrated circuit device 90, or any reference voltage that is stable. Alternatively, the bottom wall 104 and/or one or both of the side walls 106 and 108 can be connected to ground or a source of reference potential.

The enclosure 100 of the isolation structure provided by the invention is formed in the integrated circuit memory device 54 during fabrication of the integrated circuit memory device using conventional processing techniques and process parameters. Moreover, although the invention is described with reference to an application in an integrated circuit memory device such as, but not limited to, programmable logic devices, PROMs, EPROMs, EEPROMs, and memories such as SRAMs and DRAMs, the signal isolation and decoupling structure can be used in any integrated circuit device wherein it is desirable to prevent signal coupling between signal carrying conductors that extend in close proximity to one another.

Moreover, it will be understood by those skilled in the art that although the invention is described with reference to a single isolation structure, many such isolation structures are provided in the integrated circuit memory device 54 for providing signal isolation and decoupling for a plurality of conductors of the integrated circuit memory device. The isolation structures are formed during fabrication of the integrated circuit memory device using conventional integrated circuit processing techniques. The isolation structures can be provided at different layers of the integrated circuit memory device where signal isolation is needed for conductors at such locations within the integrated circuit memory device. Thus, the fragmentary views of the isolation structure provided by FIGS. 2–7, and also by FIGS. 8–15 which illustrate the process for fabricating the isolation structure in an integrated circuit device, are representative of a small portion of one of many isolation structures that are formed in the integrated circuit memory device fabricated in accordance with the present invention.

Figure 8:
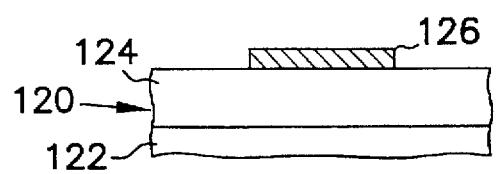
FIG. 8 is a composite cross-sectional view of an in-process wafer portion illustrating the beginning steps of the method according to the invention, wherein a layer of conductive material has been formed on a substrate.
Figure 9:
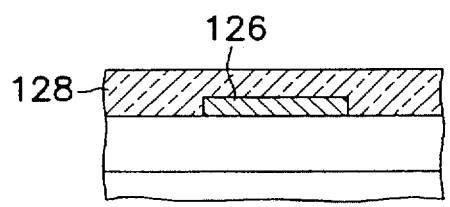
FIG. 9 is a cross-sectional view of the in-process wafer portion of FIG. 8 after formation of a dielectric cover layer.

Referring to FIGS. 8–15, the process for fabricating the isolation structure provided by the invention in the integrated circuit device will now be described. FIG. 8 is a composite cross-sectional view of an in-process wafer portion illustrating the beginning steps of the method for forming the isolation structure according to the invention. Referring to FIG. 8, the starting material can be either an n-type or p-type substrate 122 prepared using conventional process steps to include a layer 124 of dielectric material formed thereon. In the preferred embodiment, the dielectric material is silicon dioxide $SiO_2$. However, other dielectric materials can be used. The layers 122 and 124 are not sectioned in the drawings to more clearly illustrate the additional layers formed during processing of the integrated circuit structure in fabricating the isolation structure. In the first step of the process illustrated in the drawings, a layer 126 of metal is formed on the dielectric 124 using standard processes of photomasking techniques followed by deposition or diffusion of desired substances, forming the bottom wall 104 of the enclosure 100 (FIG. 3). In the preferred embodiment, the metal is aluminum. However, the metal layer 126 can be formed of other highly electrically conductive materials that are commonly used in the fabrication of integrated circuit devices. Then, a cover layer 128 of dielectric material, such as silicon dioxide, is formed on the conductive layer 126 as illustrated in FIG. 9 which is a cross-sectional view of the in-process wafer portion after formation of the dielectric cover layer 128.

Figure 10:
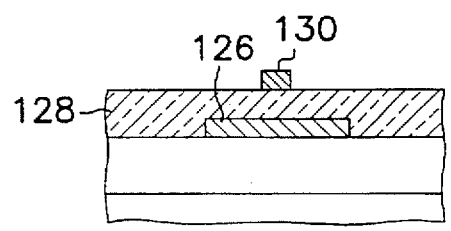
FIG. 10 is a cross-sectional view of the in-process wafer portion of FIG. 9 after formation of a conductor on the dielectric cover layer.
Figure 11:
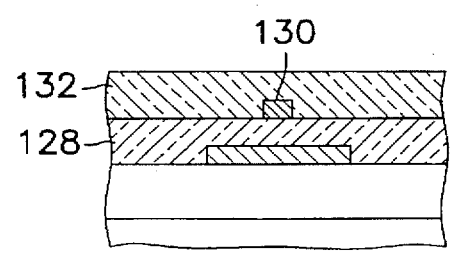
FIG. 11 is a cross-sectional view of the in-process wafer portion of FIG. 10 after formation of a further dielectric cover layer, embedding the conductor in the dielectric material.

Referring now to FIG. 10, then a further layer 130 of metal is formed on the layer 128 of dielectric material, in overlying relation with the metal layer 126, forming the conductor 90 (FIG. 3). The metal layer 130 is formed using standard processes of photomasking techniques followed by deposition or diffusion of desired substances. In the preferred embodiment, the layer 130 is aluminum. Then, a further dielectric cover layer 132, preferably of the same material as dielectric layer 128, is formed on the dielectric layer 128 and the conductor 130 formed thereon to embed or encapsulate the conductor in the dielectric material as is shown in FIG. 11. The two dielectric layers 128 and 132, which are shown in FIGS. 11–15 as two separate layers, form the dielectric material 114 that is within the enclosure (FIG. 3) and the dielectric material 116 that is located externally of the enclosure. Although shown as two separate layers to illustrate their being deposited in two separate deposition steps in the fabrication process, there is no discontinuity between two layers of dielectric material in the completed structure.

Figure 12:
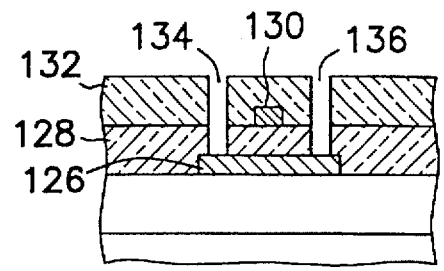
FIG. 12 is a cross-sectional view of the in-process wafer portion of FIG. 11 following a contact etch of the dielectric to the bottom layer of conductive material to form channels in the dielectric material on both sides of the conductor.

Referring to FIG. 12, in the next step of the process, a contact etch is carried out to form first and second channels 134 and 136 through the dielectric layers 128 and 132 on opposite sides of the metal layer 130 all the way down to the conductive layer 126. The channels extend along the entire length of the metal layer 126. The dielectric material extends laterally beyond the layer of conductive material or metal layer 130 and the channels are formed on opposite sides of the metal layer.

Figure 13:
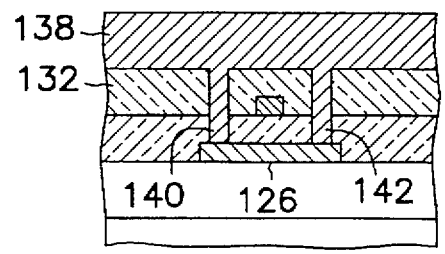
FIG. 13 is a cross-sectional view of the in-process wafer portion of FIG. 12 after depositing of conductive material thereon to fill the channels.

Following etching of the dielectric layers 128 and 132 to expose the conductive layer 126 within the channels 134 and 136, the upper surface of the upper dielectric layer 132 is covered with a layer of metal 138. The layer 138 of metal is of sufficient thickness to fill the two channels 134 and 136 all the way down to the conductive layer 126 as is illustrated in FIG. 13 and forming electrical connections to the conductive layer 126 at both sides 140 and 142 thereof and along the length thereof. The metal layer 138 preferably is formed of tungsten, but can be made of other highly conductive materials, such as silicides, preferably formed with tungsten ($TuSi_2$), titanium ($TiSi_2$) or other suitable materials.

Then, the metal layer 138 is planarized back to the upper surface 144 of the layer 132 of dielectric material using chemical mechanical polishing (CMP). This operation removes excess metal from the upper surface 144 of the layer 132 of dielectric material, forming two metal walls 146 and 148, which correspond to side walls 106 and 108. The upper portions or ends 150 and 152 of the metal walls 146 and 148 are exposed in the upper surface 144 of the layer 132 of dielectric material as is illustrated in FIG. 14.

Figure 14:
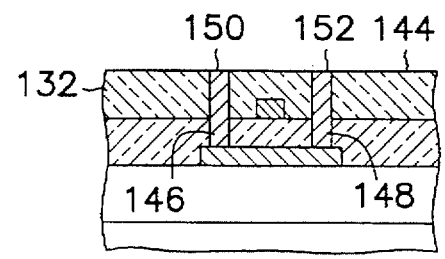
FIG. 14 is a cross-sectional view of the in-process wafer portion of FIG. 13 after planarization of the conductive material to form vertical conducting side walls in the channels on opposite sides of the conductor.
Figure 15:
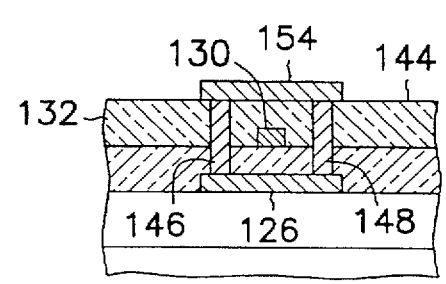
FIG. 15 is a cross-sectional view of the in-process wafer portion of FIG. 14 after formation of a further layer of conductive material.

Referring now to FIG. 15, a further layer of metal 154 is formed on the upper surface 144 of the layer 132 of dielectric material using standard processes of photomasking techniques followed by deposition of desired substances. The metal layer 154 can be formed of other highly electrically conductive materials that are commonly used in the fabrication of integrated circuit devices. The metal layer 154, which corresponds to the top wall 102 (FIG. 3) electrically interconnects the two side walls 146 and 148 to complete the formation of the isolation structure (FIG. 3) which encloses the conductor 90 formed by the layer of metal 130 in FIG. 15, for example. In the exemplary embodiment illustrated in FIGS. 8–15, the channels are located at opposite sides of the metal layer 154 and the metal layer 132 and the side walls are contained within the channels. However, either one or both of the metal layers can be formed to extend beyond the channels as is shown in FIGS. 1–5, for example.

Thus, in accordance with the invention, the conductor is enclosed within a structure of conductive material that is provided by forming first and second planar layers of conductive material in a parallel spaced relationship and forming first and second walls of conductive material which interconnect the planar layers forming an enclosure of conductive material around the conductor.

In another embodiment, the formation of the horizontal portion of conductive layer 138 (or of the conductive layer 126) is omitted, in which case the isolation structure produced has a U-shaped cross-section, as illustrated in FIGS. 3 and 14, for example. Alternatively, the forming of either side of the isolation structure can be omitted so that the isolation structure is open along one side.

Following fabrication, of the isolation structure in the integrated circuit memory device, normal processing can be continued to form further layers (not shown) in the structure, and when fabrication is completed, the integrated circuit device can be passivated in the conventional manner.

As has been indicated, it will be understood by those skilled in the art that although the fabrication process has been described with reference to forming only one insulation structure, many such isolation structures are provided in the integrated circuit memory device 54 for providing signal isolation and decoupling for many conductors of the integrated circuit memory device 54. The isolation structures are formed during fabrication of the integrated circuit memory device using conventional integrated circuit processing techniques. The isolation structures can be provided at different layers of the integrated circuit memory device and isolation structures formed in common portions of the integrated circuit structure being formed at the same steps of the process. Thus, the fragmentary views of FIGS. 8–17 are representative of the process for forming one of many isolation structures in the integrated circuit memory device fabricated in accordance with the present invention.

Figure 16:
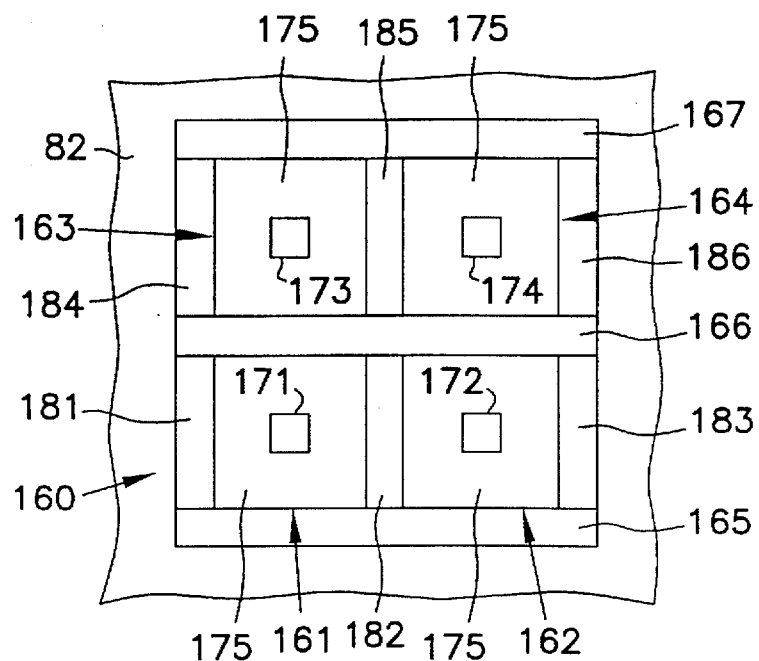
FIG. 16 is a diagrammatic end view of an integrated circuit portion having a plurality of conductor containing signal isolation and decoupling structures enclosures in accordance with a further embodiment of the invention.

In accordance with a further embodiment illustrated in FIG. 16, the isolation structure of the present invention includes an enclosure 160 having four cells 161–164 which are arranged in a two-by-two matrix for isolating four signal carrying conductors 171–174 from one another and from other conductors (not shown) located externally of the isolation structure. The conductors 171–174 are embedded in dielectric material 175 in the cells. The enclosure 160 includes a lower conductive layer 165 that is common to cells 161 and 162, an intermediate conductive layer 166 that is common to all four cells, and an upper conductive layer 167 that is common to cells 163 and 164. The enclosure 160 further includes side walls 181 and 182 of conductive material for cell 161 and side walls 182 and 183 of conductive material for cell 162. In addition, the enclosure 160 includes side walls 184 and 185 of conductive material for cell 163 and side walls 185 and 186 of conductive material for cell 164. The isolation structure is similar to and functions in the manner of isolation structure illustrated in 2–4, for example, which forms enclosure 100, except that the isolation structure forms a plurality of enclosures each providing electrical isolation for a different one of a plurality of conductors.

The process for fabricating the integrated circuit structure of FIG. 16 is similar to that described for producing the embodiment shown in FIGS. 8–15, except that in forming cells 161 and 162, a further channel is provided in the dielectric layer at the time that side walls 181 and 183 are being formed, for forming the intermediate wall 182. Also, two conductors 171 and 172 are formed in the same process step. Similarly, cells 163 and 164 are formed by providing intermediate wall 185 at the time that side walls 184 and 186 are being formed, and conductors 173 and 174 are formed in the same process step. Also, a third deposition of Tungsten metal followed by CMP is carried out to form the uppermost conductive layer 167.

Any number of cells can be formed in any arrangement up to the limitations of the integrated circuit structure. For example, the isolation structure can include a four-by-four matrix including sixteen cells, or a matrix including more than sixteen cells.

Figure 17:
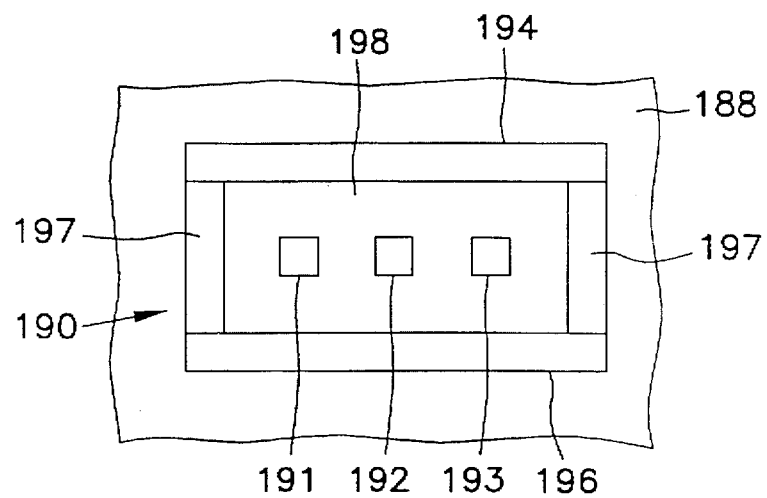
FIG. 17 is a diagrammatic end view of an integrated circuit portion including a signal isolation and decoupling structure containing a plurality of signal carrying conductors.

Referring to FIG. 17, in accordance with a further embodiment, the isolation structure of the present invention includes an enclosure 190 which is fabricated on an integrated circuit device 188 for providing isolation for a plurality of conductors 191, 192 and 193 of the integrated circuit device which are contained within the enclosure 190. The enclosure 190 includes a top wall 194, a bottom wall 196, and side walls 197 which form an enclosed metal shield for the conductors 191–193. The conductors 191–193 are embedded in dielectric material 198 within the enclosure 190. The isolation structure provides isolation of the conductors 191–193 from one or more other conductors (not shown) that extend in close proximity to the conductors 191–193. The conductors 191–193 can be "noisy" conductors in which case the isolation structure isolates these conductors from externally located conductors. Alternatively, the conductors 191–193 can be "quiet" conductors that are shielded from one or more "noisy" externally located conductors. The isolation structure is similar to and functions in the manner of the isolation structure illustrated in FIGS. 2–4, for example. Also, the isolation structure can be formed in the same manner as that described with reference to FIGS. 8–15 for a single conductor. However, the three conductors 191–193 that are formed to be contained within the enclosure 190 are formed during the same process step.

CONCLUSION

A signal isolation and decoupling structure has been described which can fabricated on an integrated circuit device. The signal isolation and decoupling structure includes parallel extending layers of electrically conductive material with first and side walls, also of an electrically conductive material, electrically connecting the layers of conductive material defining an enclosure or structure for one or more signal carrying conductors formed in the integrated circuit device. The signal isolation and coupling structure and the signal carrying conductor contained therein function in the manner of a discrete coaxial conductor, preventing signal radiation from conductors located outside of the shielding structure, and substantially eliminating cross-coupling of signals from other signal carrying conductors extending adjacent to the shielding structure.

The signal isolation and decoupling structure of the invention has been described with reference to a preferred application in an integrated circuit memory device, such as, but not limited to, programmable logic devices, PROMs, EPROMs, EEPROMs, and memories such as SRAMs and DRAMs, and in particular a random access memory device. However, the signal isolation and decoupling structure can be used in any integrated circuit device having signal carrying conductors that extend in close proximity to one another and wherein it is desirable to prevent signal coupling between such conductors. The signal isolation and decoupling structure is advantageously used for providing electrical isolation between "noisy" signal conductors, such as, but not limited to, input/output conductors, address input conductors, clock signal conductors or any other type of signal conductors that carry fast switching signals, as well as between "noisy" signal conductors and signal conductors that carry data signals, bias signals, and the like. Another application of the signal isolation and decoupling structure is to field emission display devices for isolating the drive signals of the field emission devices from one another. Thus, although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A signal isolation and decoupling structure fabricated in an integrated circuit device for providing electrical isolation between first and second signal carrying conductors, portions of which extend in close proximity to one another in said integrated circuit device, at least one of said conductors carrying fast switching signals, and said integrated circuit device having an electrically conductive substrate, said signal isolation and decoupling structure comprising:

first and second elements of an electrically conductive material spaced apart from one another, said first and second elements extending along at least a portion of the length of said first conductor, said second element not coextensive with said substrate and insulated from said substrate by an insulating material;

dielectric material located between said first and second elements of conductive material, with at least said first conductor being embedded in said dielectric material; and interconnecting means including a third element of a continuous segment of an electrically conductive material electrically interconnecting said first and second elements, said third element extending along at least said portion of the length of said first conductor, forming an enclosure of electrically conductive material that extends around said first conductor leaving the first conductor partially exposed along at least said portion of the length, for electrically isolating said first conductor from at least said second conductor which is located externally of said enclosure.

2. The signal isolation and decoupling structure of claim 1, wherein said first and second elements form first and second walls, respectively, of said enclosure, said third element extending between said first and second elements, electrically interconnecting said first and second elements and forming a third wall of said enclosure.

3. The signal isolation and decoupling structure of claim 2, wherein said first, second, and third elements are generally planar in shape, and said first, second, and third walls form a partially closed structure for said first conductor that is generally rectangular in cross-section.

4. The signal isolation and decoupling structure of claim 1, wherein said enclosure partially encloses said first conductor over substantially the entire length thereof.

5. The signal isolation and decoupling structure of claim 1, wherein said dielectric material extends laterally beyond said first and second elements, and wherein a channel is formed in said dielectric material, and wherein said third element is contained within said channel.

6. The signal isolation and decoupling structure of claim 1, wherein said enclosure is closed on three sides thereof and is open on a fourth side.

7. The signal isolation and decoupling structure of claim 1, wherein at least one of said elements is connected to a source of a reference potential.

8. The signal isolation and decoupling structure of claim 1, wherein a plurality of said conductors are contained within said enclosure.

9. The signal isolation and decoupling structure of claim 1, including a plurality of said enclosures, each of said enclosures providing electrical isolation for a different one of said conductors.

10. The signal isolation and decoupling structure of claim 2, wherein said conductive material forming said first and second walls is comprised of aluminum.

11. The signal isolation and decoupling structure of claim 2, wherein said conductive material forming said third wall is comprised of tungsten.

12. The signal isolation and decoupling structure of claim 1, wherein said dielectric material is comprised of silicon dioxide.

13. A signal isolation and decoupling structure fabricated in an integrated circuit device for providing electrical isolation between first and second signal carrying conductors, portions of which extend in close proximity to one another in said integrated circuit device, at least one of said conductors carrying fast switching signals, and said integrated circuit device having an electrically conductive substrate, said signal isolation and decoupling structure comprising:

first and second elements of an electrically conductive material spaced apart from one another, said first and second elements extending along at least a portion of the length of said first conductor, said first element not coextensive with said substrate and said second element insulated from said substrate by an insulating material;

dielectric material located between said first and second elements of conductive material, with at least said first conductor being embedded in said dielectric material; and interconnecting means including a third element of a continuous segment of an electrically conductive material electrically interconnecting said first and second elements, said third element extending along at least said portion of the length of said first conductor, forming an enclosure of electrically conductive material that extends around said first conductor leaving the first conductor partially exposed along at least said portion of the length, for electrically isolating said first conductor from at least said second conductor which is located externally of said enclosure.

14. The signal isolation and decoupling structure of claim 13, wherein said first and second elements form first and second walls, respectively, of said enclosure, said third element extending between said first and second elements, electrically interconnecting said first and second elements and forming a third wall of said enclosure.

15. A signal isolation and decoupling structure fabricated in an integrated circuit random access memory device for providing isolation between signal carrying conductors, portions of which extend in close proximity to one another in said integrated circuit random access memory device and said integrated circuit random access memory device having an electrically conductive substrate, said signal isolation and decoupling structure comprising:

first and second continuous segments of an electrically conductive material spaced apart from one another forming opposing side walls;

dielectric material located between said side walls of conductive material;

at least a first one of said conductors being embedded in said dielectric material;

a layer of a first electrically conductive material extending between said side walls and electrically interconnecting said side walls forming a bottom wall insulated from said substrate by an insulating material;

said bottom wall and said side walls forming an enclosure of electrically conductive material around said first conductor that is open opposite said bottom wall for electrically isolating said first conductor from at least a second one of said conductors that is located externally of said enclosure.

16. The signal isolation structure and decoupling according to claim 15, wherein said first conductor is an elongated element, and wherein said enclosure partially encloses said first conductor over substantially the entire length thereof.

17. The signal isolation and decoupling structure according to claim 15, wherein said first segment, said second segment, and said first conductive material are generally planar in shape, whereby said bottom wall, and said side walls form an enclosure for said first conductor that is generally rectangular in cross-section.

18. A signal isolation and decoupling structure fabricated in an integrated circuit random access memory device for providing isolation between signal carrying conductors, portions of which extend in close proximity to one another in said integrated circuit random access memory device and said integrated circuit random access memory device having an electrically conductive substrate, said signal isolation and decoupling structure comprising:

first and second continuous segments of an electrically conductive material spaced apart from one another forming opposing side walls;

dielectric material located between said side walls of conductive material;

at least a first one of said conductors being embedded in said dielectric material;

a layer of a first electrically conductive material extending between said side walls and electrically interconnecting said side walls forming a top wall;

said top wall and said side walls forming an enclosure of electrically conductive material around said first conductor that is open opposite said top wall for electrically isolating said first conductor from at least a second one of said conductors that is located externally of said enclosure.

* * * * *